(12) United States Patent
Haldar (10) Patent No.: US 9,307,662 B2
(45) Date of Patent: Apr. 5, 2016

(54) FREE ELECTRON WIRE

(76) Inventor: Sabyasachi Haldar, Kolkata (IN)

( * ) Notice: Subject to any disclaimer, the term of this patent is extended or adjusted under 35 U.S.C. 154(b) by 731 days.

(21) Appl. No.: 13/583,932

(22) PCT Filed: Feb. 13, 2012

(86) PCT No.: PCT/IN2012/000094
§ 371 (c)(1),
(2), (4) Date: Sep. 11, 2012

(87) PCT Pub. No.: WO2013/042136
PCT Pub. Date: Mar. 28, 2013

(65) Prior Publication Data
US 2013/0098655 A1  Apr. 25, 2013

(30) Foreign Application Priority Data

Sep. 20, 2011 (IN) .......................... 1224/KOL/2011

(51) Int. Cl.
| | |
|---|---|
| H05K 5/06 | (2006.01) |
| H01R 13/02 | (2006.01) |
| H01B 13/00 | (2006.01) |
| H01L 39/00 | (2006.01) |

(52) U.S. Cl.
CPC ................. *H05K 5/06* (2013.01); *H01B 13/00* (2013.01); *H01L 39/005* (2013.01); *H01R 13/02* (2013.01)

(58) Field of Classification Search
CPC ......... H05K 5/06; H05K 5/069; H01B 12/00; H01B 13/00; H01J 21/00; H01J 21/02; H01L 39/00; H01L 39/02; H01L 39/005; H01R 13/02; H01R 13/00; H01R 13/005
USPC .............. 174/9 R, 8, 68.1, 251, 125.1, 126.1, 174/50.52, 50.5; 313/305, 306, 307, 303, 3; 62/3.1; 439/884, 890
See application file for complete search history.

(56) References Cited

U.S. PATENT DOCUMENTS 4,719,388 A * 1/1988 Oess ..................... H01J 31/126
313/302
5,024,059 A * 6/1991 Noble ....................... F25B 1/00
62/3.1

(Continued)

FOREIGN PATENT DOCUMENTS

| CN | 1401976 A | 3/2003 |
|---|---|---|
| CN | 1705219 A | 12/2005 |

(Continued)

*Primary Examiner* — Angel R Estrada (57) ABSTRACT

This invention relates to New Free Electrons Wire ($4a$, $b$), which will enable the use of electrical energy and also energy in various other forms in a loss free way at room temperature. Free Electrons confined in vacuum ($4a_1$) at the order of $10^{-4}$ torr or more, at the core of the wire, can move a distance as long as about, to a few kilometers without any collision. The vacuum is maintained in a tube made up of alternate layers of Teflon ($4a_2$) and Silicon Oxynitride ($4a_3$) The columbic repulsion between these free electrons ($4b_1$, $4b_2$, $4b_3$ ... ) will actually conduct energy without any loss. The free electrons trapped in vacuum tube ($4a$), should be at a particular density of around $2.02 \times 10^8$ electrons in the area covered by the input device ($4b_4$) or output device ($4b_5$) and also all along the Free Electron Wire. The input device ($4b_4$) is to deliver energy to the free electrons ($4b_1$, $4b_2$, $4b_3$ ... ) of the New Free Electrons Wire ($4a$, $b$), for loss free transportation and various other uses of energy. The output device ($4b_5$) on the other end or anywhere on the wire, is to recollect the energy from the free electron wire, for different uses. The density of the electrons, inside the vacuum tube ($4a$) can be varied by changing the potential at the metal encapsulation of the wire and hence the covered are of the Input device ($4b_4$) and the output device ($4b_5$) over the free electron wire ($4a$, $b$) should also be changed. The covered are of the Input device ($4b_4$) and the output device ($4b_5$) over the free electron wire ($4a$, $b$) bears a definite ratio with the free electrons ($4b_1$, $4b_2$, $4b_3$ ... ) of the wire. Finally there will be a metal encapsulation(s) ($4a_4$) over the wire to keep the electromagnetic field remain confined within the free electron wire ($4a$, $b$) to make it harmless in all respect to the health of living creatures, who may come in close contact with the wire. Apart from energy transportation the free electron ($4a$, $b$) wire is also capable of generating very high electromagnetic field generated by these free electrons ($4b_1$, $4b_2$, $4b_3$ ... ), simply by removing the metal encapsulation(s) ($4a_4$), which can be used for various other electrical and non-electrical purposes. The materials and techniques adopted to create this New Free Electron Wire ($4a$, $b$) will enable it to get produced commercially at the cost of general copper wires.

7 Claims, 6 Drawing Sheets

(56) References Cited

U.S. PATENT DOCUMENTS 6,465,965 B2 * 10/2002 Nelson ............... F24J 3/00
250/305
2011/0254449 A1 10/2011 Murnick et al.

FOREIGN PATENT DOCUMENTS

IN  20050080812  11/2005
IN  20100040712  4/2010

* cited by examiner

Fig. 5a (Angular View)

Fig. 5b (Front View)

Fig. 5c (Angular View)

FREE ELECTRON WIRE

CROSS REFERENCE TO RELATED APPLICATIONS

Prior Arts

Free Electron laser (FEL): Unlike FEL this invention uses free electrons as energy carriers or uses the fundamental properties of free electrons to transported and use of energy in a loss free way. It has nothing to do with the radiation or dissipation of any kind of energy apart from using the varying electromagnetic flux generated by the free electrons of the wire in acceleration and to recollect energy from the wire; whereas FEL deals with the optical energy radiated by the accelerated free electrons only and this invention doesn't deal with the optical energy generated by the accelerated free electrons in any way. Also the invention of "New Free Electron Wire" uses confined electrons and not dynamic electrons like FEL. Hence there is a huge fundamental difference between the two.

Klystron: This invention relates to a vacuum tube containing an electron gun, a resonator that changes the velocity of the electron beam in accordance with a signal (buncher resonator), a drift tube in which the electron velocity does not change, another resonator that abstracts energy from the electron beam (catcher resonator), and an electrode that collects the electrons (collector electrode). Whereas firstly New Free Electron Wire doesn't use electron beam, rather it operates by using free electrons confined in a definite volume of vacuum. Secondly a constant production of electron beam with the help of an electron gun is required in Klystron whereas New Free Electron Wire uses permanently confined free electrons in a definite volume of vacuum, once and for all till the wire will exist. So there are huge fundamental differences in very basic construction and operating procedures in between the two.

Electron Beam Ion Trap (EBIT): Unlike EBIT, the electrons remain confined within a definite volume of vacuum created inside a tube, due to the material used to make the body of the tube. Moreover in the free electrons in case of New Free Electron Wire, are not constantly generated electron beam from an electron gun; but they are free electrons confined in a definite volume of vacuum once and for the entire lifespan of the wire, whose fundamental properties are used to develop devices, which will enable loss free utilization of energy. So there are huge fundamental differences in very basic construction and operating procedures in between the two.

Computer simulation and experimental studies of electron beam acceleration, transport and recovery in a depressed collector (Russian Paper): This Russian paper describes an experiment to show the energy carried by an electron beam generated instantaneously for a very short period of time by transforming gas into plasma. But New Free Electron Wire uses permanently confined free electrons in a definite volume of vacuum. So there are huge fundamental differences in very basic construction and operating procedures in between the two.

Method and System for Energy conversion Using Screened—Free—Electron Source (US 2002/0067131 A1) (U.S. Pat. No. 6,465,965): Unlike confined free electron inside a vacuum tube made up of certain materials, once and for all, in case of New Free Electron Wire; this invention uses a continuously generated free electron beam from an electron gun. Also the confined free electron inside a vacuum tube made up of certain materials, once and for all, in case of New Free Electron Wire doesn't hit any conducting surface or electrode and remains confined as long as the wire exists. So there are huge fundamental differences in very basic construction and operating procedures in between the two.

Flat Electron Control Device Utilizing a Uniform Space—Charge Cloud of Free Electrons as a Virtual Cathode (U.S. Pat. No. 4,719,388): This invention also uses a continuously generated free electron beam from cathode and confined within a flat or planer volume to form a space charge and to impinge on specific areas of the electrically positive screen to produce desired image. But the confined free electron inside a vacuum tube made up of certain materials, once and for all, in case of New Free Electron Wire doesn't hit any positive screen or electrode and remains confined as long as the wire exists. Moreover these electrons are confined in cylindrical shaped very long tubes and not inside planer volume. So there are huge fundamental differences in very basic construction and operating procedures in between the two.

Fifth Force Apparatus and Method for Propulsion (US 20100251691A1 & PCT/US07/82074): This invention uses the repulsive force of electrons to develop a fifth force between a beam of electrons and a neutral beam of atoms or molecules; where the properties of electrons are not patentable at all, because they are already known vividly to public. On the other hand the invention of "New Free Electron Wire" uses the one of the known four forces i.e. the columbic repulsion between free electrons present at a particular density i.e. if these free electrons maintain a calculated distance among themselves then they can be used to manufacture electrical and non-electrical devices which will enable loss free use of energy. In the invention of "New Free Electron Wire" the use of the know properties of electrons in a definite way to develop something new has been claimed but not the properties of electrons. Only, "the new method of use of electrons" and "methods to manufacture a new device" which will enable such a new method of using free electrons has been developed and claimed. So there are huge fundamental differences in very basic construction and operating procedures in between the two.

STATEMENT REGARDING FEDERALLY SPONSORED RESEARCH OR DEVELOPMENT

Not Applicable

STATEMENT OF INVENTION

The entire research and development of this invention has been conducted solely by the inventor (my-self) alone and entirely privately, by spending money out of my own pocket, without any kind of help from any individual or any organization.

All the expenses of the patent applications, starting from the domestic Indian patent application numbered 1224/KOL/2011, the PCT Application numbered PCT/IN2012/000094 and this national stage U.S. Patent Application are also spend by myself only, without any kind of help from any individual or any organization.

OBJECT OF INVENTION

This invention is to create a new kind of wire that can be used to replace conventional metal wires, for loss free electrical transmission at room temperature and loss free utilization of energy in various forms. Electrical appliances can be made far more efficient in terms of their energy consumption verses their power by the use of this New Free Electron Wire to redesign and manufacture them.

This wire can be used to create coils with very high energy efficiency. These coils can be used to create very highly efficient motors, transformers and many other electrical appliances. The performance of these electrical appliances will be very high in terms of energy i.e. they will consume least amount of energy and do much grater amount of work. As for example very powerful and efficient motors that can be used in automobile industry to make absolutely pollution free electric cars, which may in due time replace the fossil fuel cars at all. The use to these wires to create the motors of automobiles will make them as powerful as fossil fuel cars but extremely efficient i.e. these cars will be very fuel efficient or in other words comparatively much smaller batteries can be used to drive even huge vehicles like ten wheelers to drive for long distances without recharging the batteries. Also these wires can be used where very high electromagnetic fields are required like MRI machines in medical field etc.

BACKGROUND OF INVENTION

Every material in this world has electrical resistance which is responsible for huge loss of energy mainly during electrical transmission and also this loss reduces the efficiency of electrical appliances. This loss free, "New Free Electron Wire" will address to the biggest, very basic and fundamental problem of electrical engineering, to create a electrical wire or device that will enable the use of electricity, virtually in a loss free way. This wire can also be used to enable the use of various other forms of energy in a loss free way.

FIELD OF INVENTION

This invention lies, in the area of Solid State Physics, Plasma Physics. From the engineering point of view it deals with developing a new kind of electrical conductor with a very high capacity of almost loss free transportation and use of energy. Hence it lies in the field of Electrical Engineering.

BRIEF SUMMARY OF THE INVENTION

New Free Electron Wire to develop a system for almost a Loss Free utilization of energy has been invented by adopting various methods. The basic criteria to create the "New Free Electron Wire" for Loss Free utilization of energy, in my way, is that there should be abundant availability of free mobile electrons i.e. in one word electrons should be able to move grate distances without any collision or disturbances and the wire should have Zero electrical resistance at Room Temperature. I have done this by trapping free electrons in a high vacuum tube rather than cooling any material to create free long distance paths for electrons. We all know that in a vacuum at the order of $10^{-7}$ torr or $10^{-8}$ torr electrons can move a distance as long as about, to a few kilometers without any collision. Now a day, technologies are available even to make vacuum at the order of $10^{-12}$ torr. Here columbic interaction between Free Electrons confined in a specially designed vacuum tube will enable the use of energy without any loss at room temperature and will generate huge amount of electromagnetic field. We can think of the columbic interaction between these free electrons to be perfectly elastic (the term "perfectly elastic" is used from a different branch of physics to describe the situation in a very easily understandable way and in very short) and hence they will transport and enable the use of energy in various forms without any loss.

Power generated in power plants can be transported to its consumers thousands of kilometers away without any loss on the way of transportation. Hence this will save a lot of natural resources and money. So this invention can turn out to be the best Green Technology for the future generations. Also as we are dealing with only free electrons, they will generate huge electromagnetic field when they are in any kind of motion and this huge amount of electromagnetic filed can be used for various commercial purposes.

The cost effective materials used to manufacture this wire like Teflon, Silicon Oxy-Nitride ($SiO_2$—$Si_3N_4$—$SiO_2$) and a thin layer of metal foil like the one to wrap food or a little bit thicker than that, will make its production cost more or less equal to that of normal copper wires. As this device works on the basic principles of free electrons trapped in a vacuum tube at the order of $10^{-4}$ torr to $10^{-8}$ torr hence the arrangements for free electron generation and vacuum creation is required. Also an arrangement for thin film deposition of Silicon Oxy-Nitride is also necessary. But these are all one time investments and millions of kilometers of Free Electron wires can be produced from this setup once established. Hence it can be safely concluded that the regular production cost of the Free Electron Wire will not cost more than general copper wires.

To set up a full fledge transmission network, points and problems like joining the wires, taking out branch lines from the main lines, how to deliver electricity from the Free Electron Wire and even if the wire gets snapped at some point, how to reconnect the two snapped ends of the wire to restore the transmission line within a shot period of time, has been considered and solved efficiently and cost effectively. To do this specially designed, cost effective—DIRECT and INDIRECT CONNECTORS has to be used. To recharge a snapped wire with free electrons and to restore the vacuum, installations of free electron generating device and vacuum machine can be set up in a mobile van to attend snapping problems anywhere in the network. To deliver electricity to the consumers there will be main switch like devices in the main switch board or room, from where electricity will be distributed all over the building.

Apart from establishing a loss-free transmission line this technology can be used to establish a solar based power plant which in due time can be efficient and large enough to supply power to run entire cities or may be even the entire nation with clean, environment friendly and most importantly cheaper electricity which is the backbone of modern human civilization.

Specially designed coils made by this wire can be used to make very powerful and efficient motors that can be used in automobile industry to make absolutely pollution free electric cars, which may in due time replace the fossil fuel cars at all. The use to these wires to create the motors of automobiles will make them as powerful as fossil fuel cars but extremely efficient i.e. these cars will be very fuel efficient or in other words comparatively much smaller batteries can be used to drive even huge vehicles like ten wheelers to drive for long distances without recharging the batteries. Also these wires can be used where very high electromagnetic fields are required like MRI machines in medical field etc.

Hence this technology will be the backbone of various other technologies already in commercial use. Where ever this technology will be used it will increase the efficiency of that machine radically. So undoubtedly this technology has an excellent commercial future.

BRIEF DESCRIPTION OF DRAWINGS

Procedure to read the Drawings in various parts of the whole application: Every major component of this invention when mentioned in the application is accompanied by its relevant position in drawings with a particular alpha-numeric numbering system in the brackets.

(i) In the bracket the first numeric in big case represent the figure number.
    (ii) The first numeric sometimes is accompanied by an alphabet, if the figure is subdivided e.g. a, b . . . etc.
    (iii) All the numeric subscripts denote an individual component in a figure or sub-figure.
    (iv) Sometimes there is a second big case numeric in the brackets with 'coma' which represent a different second figure entirely, with numeric subscript to identify the same component in the other figure as in the first set of representations.
    (v) For Example—($4a_3$, $2_2$) represents '4' as FIG. 4; 'a' as sub-figure '$4a$' of FIG. 4; the numeric subscript '3' as the particular component Silicon Oxynitride or equivalent in FIG. 4a. The second numeric '2' represents FIG. 2 and the numeric subscript '2' represents the same material or component, Silicon Oxynitride or equivalent in FIG. 2.

FIG. 2: Shows schematically, the different layers by which the body of the New Free Electron Wire is made up of.

DETAILED DESCRIPTION OF INVENTION WITH REFERENCE TO DRAWINGS/EXAMPLES

For our own convenience and to conduct a sample test with ease let us take a vacuum tube of cylindrical shape of length 1 meter or 1000 mm, and 2 cm or 20 mm in diameter and made up of alternate layers of Teflon and Silicon Oxynitride. We will proceed with our calculation on this and we will see that our calculation will be proved to be effective in this 1 m long with 2 cm diameter tube. Hence if we proceed by increasing the length and put the increased length values in the mathematical equations, we will see that it still works. Hence it will work even if the tube is 100s of kilometers long for real transmission lines.

Also there are two identical copper coils on both ends of the proposed wire to deliver electrical energy in the form of an Alternating Current (A.C) and to recollect that electricity for commercial use or to test the efficiency of the wire after the AC gets transported to the other end of the wire.

In this sample calculation we will taste the wire with 230 volt/2 ampere AC.

Here the New Free Electron Wire for Loss Free Electrical Transmission or loss free utilization of energy has been created with the help of absolutely free electrons trapped in a vacuum tube. The perfectly elastic columbic interaction, between the free electrons, confined in a vacuum tube will transport electricity without any loss. This concept is proved below with the help of A Sample Mathematical Calculation and method(s):

As stated before we are supposed to have electrons and only electrons inside a vacuum tube. Now we have to calculate that there should be how many electrons inside the tube and the average distance between electrons?

Now form coulomb's law we know that $F=(1/4\Pi\in)\times(q_1 \cdot q_2)/r^2$. If we consider $q_1$ & $q_2$ be constants then $r^2$ is inversely proportional to F. So we can conclude that if the electrons inside the vacuum tube come infinitely close to the electrons of the inner most wire wall, the force F will increase and will be strong enough to knock out electrons from the wire wall. So if even one electron gets knocked out from the wire wall, the body of the wire will be short of electrons and will try to draw electrons from inside the tube (as electrons inside the tube are free and easily available) to remain neutral or uncharged and thus the process may continuous and there may be a continuous flow of electrons from inside the tube and in the process a time will come when there will be no electrons inside the tube. So the electrons inside the tube must be at a considerable distance from the inner most wire wall.

Figure 2:
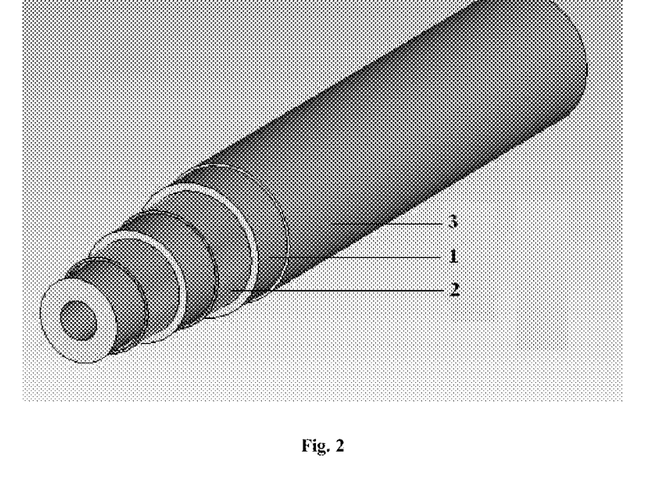
Figure 4A:
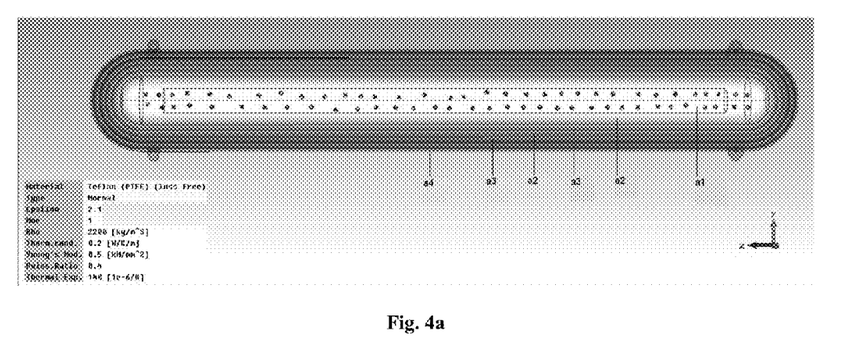
FIG. 4a, 4b: Shows the whole invention schematically with all its components and only ONE utility or application.
Figure 4B:
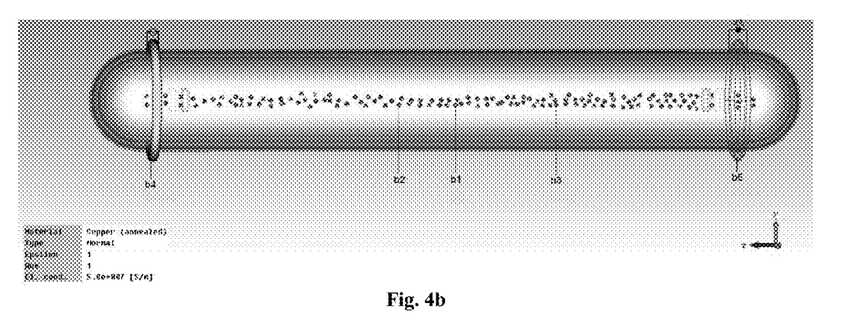
Figure 6:
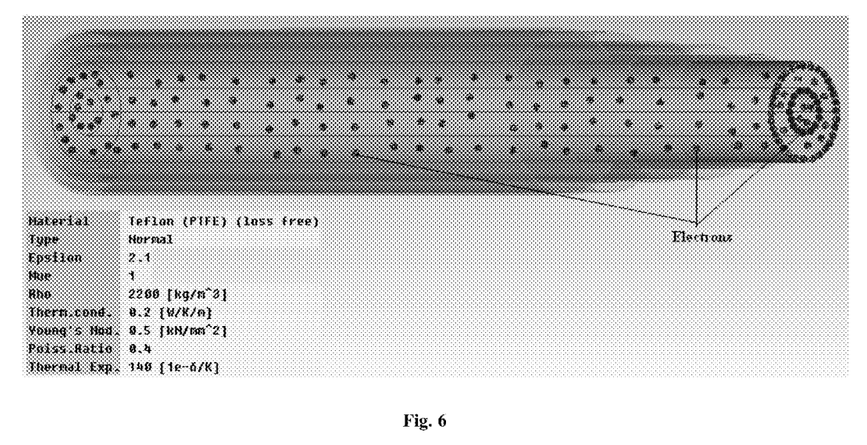
FIG. 6: Shows schematically how the individual materials used to make the body of the New Free Electron Wire, will help to keep the free electrons remain confined at the core of the wire for considerable amount of time to make the wire capable for commercial uses.

The body of the tube will be made up of layers of Ceramic or Polymer or Dielectric Material or Teflon (PTFE=Polytetrafluoro ethylene, PFA=Perfluoro alkoxy, FEP=Fluorinated ethylene), as per requirement ($2_1$, $4a_2$) and Silicon Oxy-Nitride ($SiO_2$—$Si_3N_4$—$SiO_2$) or Silicon Dioxide ($SiO_2$) or Silicon Nitride ($Si_3N_4$) or Ceramic Materials or Polymers or Dielectric Materials ($2_2$, $4a_3$). $1^{st}$ there will be a layer of Ceramic or Polymer or Dielectric Material or Teflon (PTFE=Polytetrafluoro ethylene, PFA=Perfluoro alkoxy, FEP=Fluorinated ethylene), as per requirement ($2_1$, $4a_2$) then over it, Silicon Oxy-Nitride ($SiO_2$—$Si_3N_4$—$SiO_2$) or Silicon Dioxide ($SiO_2$) or Silicon Nitride ($Si_3N_4$) or Ceramic Materials or Polymers or Dielectric Materials ($2_2$, $4a_3$), then again Ceramic or Polymer or Dielectric Material or Teflon (PTFE=Polytetrafluoro ethylene, PFA=Perfluoro alkoxy, FEP=Fluorinated ethylene), as per requirement ($2_1$, $4a_2$) and Silicon Oxy-Nitride ($SiO_2$—$Si_3N_4$—$SiO_2$) or Silicon Dioxide ($SiO_2$) or Silicon Nitride ($Si_3N_4$) or Ceramic Materials or Polymers or Dielectric Materials ($2_2$, $4a_3$). We know Teflon is a very good material that can get statically charged i.e. to some extent it has the capacity to gather electrons within itself and can be made negatively charged. Now this negative static charge will prevent the free electrons inside the wire to escape. The inner most Teflon layer will get saturated at one point by gathering electrons and not been able to release them because of the number of alternate layers of Teflon and Silicon Oxy-Nitride coating over it. Thus its inner most tubular surface will get deposited by a layer of electrons. This electron layer will stop the free electrons coming towards the wire wall because of the columbic repulsion among themselves and thus will stop them to escape. Also this will stop the free electrons to collide with the vacuum tube wall. Also the resistivity of Teflon is very high which will play an additional role to keep free electrons confined within the tubular shaped wire. Moreover Teflon will give good mechanical strength and durability to the wire. Hence Teflon can be the best material to make the body of the wire. A schematic diagram of the above mentioned situation is shown in FIG. 6.

There will be a high amount of electric field due to the free electrons inside the tube. As the electrons inside the tube are absolutely free a slightest variation in the electric or magnetic field by the In Put coil (A) shown in FIG. 1g will make the free electrons inside the tube vibrate inside the volume of the input coil and this vibration will be transported by the columbic repulsion of the electrons all throughout the tube to the electrons inside the volume of the Out Put Coil (B). So obviously there will be a huge amount of flux change through the Out Put coil (B) in FIG. 1g leading to an induction of e.m.f. in the coil. We can calculate and prove that the In Put POWER through the In Put Coil (A) will be transmitted without any loss to the Out Put Coil (B).

Figure 1A:
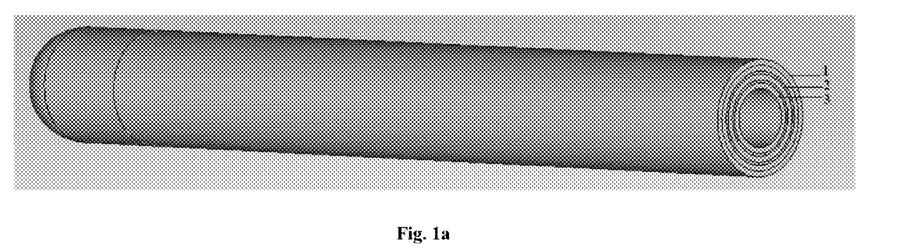
FIGS. 1a to 1g: Shows schematically, step by step, simplest manufacturing methods of New Free Electron Wire to develop a simplest model of the invention.
Figure 1B:
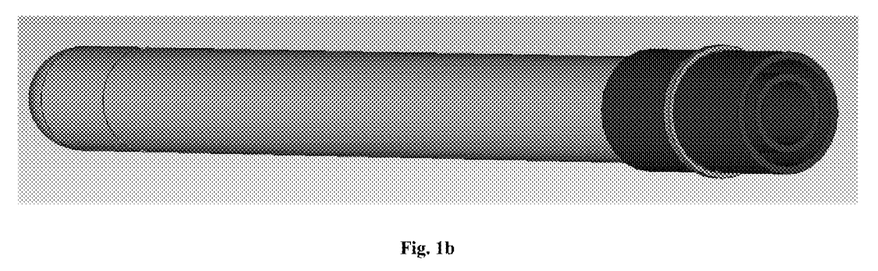
Figure 1C:
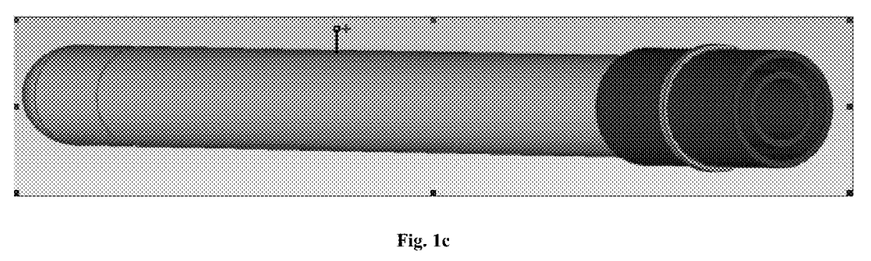
Figure 1D:
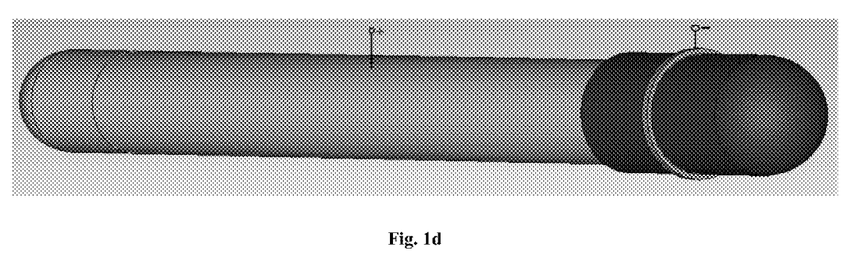
Figure 1E:
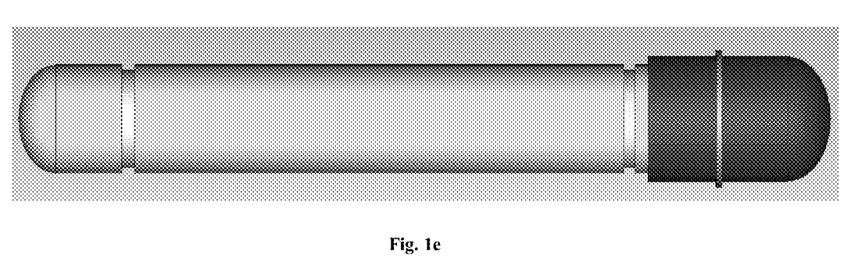
Figure 1F:
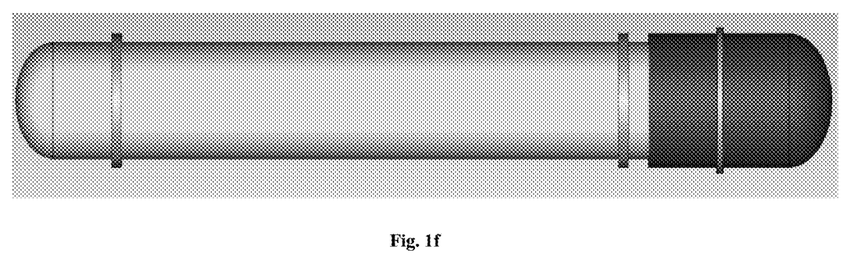
Figure 1G:
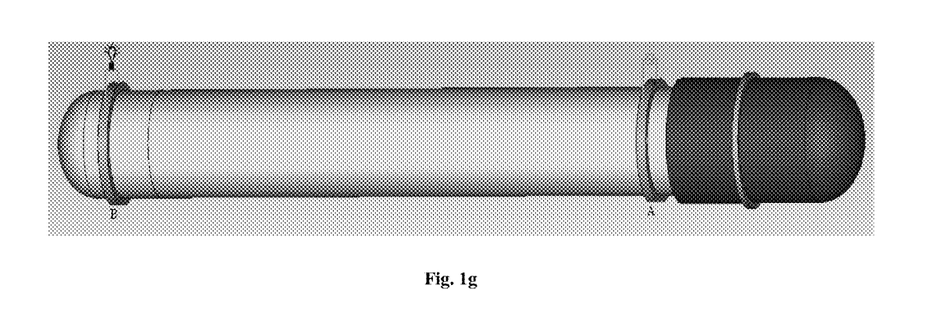

All coils in the In Put and in the Out Put in FIG. 1g have approximately 1000 turns and the total resistances of the coils with the resistance of the wire of the coils and the inductive resistance due to AC together will be such that there will be a current of 2 ampere flowing through the coils at the r.m.s. value of the voltage of the applied AC. This is taken so as to make the calculations easier. Over the tube coils are wound and through the Input coil an Alternating Current (A.C) is applied to create changing flux to make the electrons move to and fro so that we can have a good changing flux through our output coil. We know that our supply line gives us a current of 50 cycles/sec. so one cycle gets completed in 20 milli-second. Now by the property of a sinusoidal A.C. we know that, for the $1^{st}$ 5 millisecond the voltage will increase and hence the current will also increase proportionately (as the resistance of the coil is constant) and then at the $5^{th}$ millisecond it will attain maximum voltage and hence the maximum current will pass through the coil, at this instance. Then for the next 5 millisecond the voltage and hence the current will decrease going back to zero. Then the voltage along with the current will flow in the reverse direction in the same way as mentioned above.

Now we know that magnetic field at a point due to a coil of 'n' turns is $$B''=(\mu_0 \times n \times i) \div (2 \times a)$$

Where B''→the magnetic field produced
 $\mu_0$→permeability of air ($1.256 \times 10^{-6}$ H/m)
 n→number of turns of coils (1000)
 i→current flowing through the coils (2)
 a→radius of the coils (2 cm or 0.02 m)
Now putting the values we get $$B'' = (1.256 \times 10^{-6} \times 1000 \times 2) \div (2 \times 0.02)$$
$$= 0.0628 \text{ Tesla}$$
$$= 628 \text{ gauss}$$

So the above calculated magnetic flux will change according to the change in current mentioned above. Hence the change of magnetic field from 0 Tesla to 0.0628 Tesla will take place in 5 milli-second since we have applied a 230 volt A.C. and made the coil in such a way so that there is such a resistance to allow a 2 ampere of current through the coil when the A.C voltage attains the R.M.S value i.e. 230 volt.

Now we will try to calculate by using Faraday's Law what will be the induced e.mf. (ξ) in the region inside the tube covered by the In Put coil (A) in FIG. 1g. From Faraday's Law we know that if there is a change in magnetic flux ($d\Phi B/dt$) through a coil of 'N' turns then the induced e.m.f. in the coil is:

$$\xi = -N(d\Phi B/dt)$$

We can also modify the above equation to find out what will be the electric field due to changing magnetic field and the expression for that is:

$$\oint E \cdot ds = -(d\Phi B/dt).$$

From this relation we will find out the electric field due to the above calculated changing magnetic flux and hence find out the influence due to this varying magnetic flux on each electron.

Again we know $\Phi B = B \cdot A$
Where, B→is the magnetic flux;
 A→is the area in the magnetic field.

Here we will take the area of an electron as we want to calculate the influence due to this varying magnetic flux on each electron. We know that the radius of an electron is ($2.5 \times 10^{-14}$) meter.

$$\text{So, } A = \Pi \times (2.5 \times 10^{-14})^2$$

$$\text{So } \Phi B = B \cdot A = B \times \{\Pi \times (2.5 \times 10^{-14})^2\} = B \times 2 \times 10^{-27}$$

Now $d\Phi B/dt = 2 \times 10^{-27}$ $(dB/dt) = 2 \times 10^{-27} \times 0.0628 \times (5/1000) = (6.28 \times 10^{-31})$ Weber (Wb) [dB=0.0628 Tesla dt=5/1000 for $1^{st}$ 5 milli-second]. As the coils we have wound is cylindrical in shape so we can assume that the electric field (E) has same value at all points inside the symmetrically cylindrically shaped coil. So the left hand of the equation reduces to E·$\oint ds = -(d\Phi B/dt)$ We will take the circumference of an electron for $\oint ds$ so that we get to know the influence of the changing magnetic flux due to the In Put coil (A) on each electron. So the circumference of an electron is $2 \times \Pi \times (2.5 \times 10^{-14})^2 = (1.6 \times 10^{-13})$ m So from Faraday's equation we get $$E=(1/\oint ds) \times (d\Phi B/dt)=\{1/(1.6 \times 10^{-13})\} \times (6.28 \times 10^{-31})= (3.93 \times 10^{-18}) \text{ volts/m}$$

So, force on each electron due to this electric field is $F_1 = qE$
Where $F_1$→is the required force
 q→is the charge of an electron
 E→is the calculated electric field $$\text{So } F_1=(1.602 \times 10^{-19}) \times (3.93 \times 10^{-18})=(6.3 \times 10^{-37})$$
Newton Again we know: Force($F$)=mass($m$)×acceleration($a$)

$$\text{Or } a=F_1/m \text{ or } a=(63 \times 10^{-37})/(9.12 \times 10^{-31})=6.9 \times 10^{-7} \text{ m/sec}^2$$

Now from Newton's laws of motion $$v = u + at$$

where: —v→final velocity
 u→initial velocity
 a→acceleration
 t→time of acceleration, here 5 millisecond Here the electrons have an initial velocity as they are free and kept at room temperature. But we will neglect that velocity of electrons due to room temperature and consider that the electron is initially at rest. This is because if we consider that the electrons are at an initial velocity due to room temperature then we will have to consider that the electrons are socking up some energy form the atmosphere. But here we set out to prove whether our experimental set up is a loss free, free electron wire or not i.e. to find out whether the free electrons are transferring the exact amount of the energy we are putting in through the In Put to the Out Put coil. So we will neglect the velocity of electrons due to room temperature or due to any other factor.

$$\text{So, } v=0+\{6.9 \times 10^{-7} \times (5/1000)\}=3.45 \times 10^{-9} \text{ m/sec}=3.45 \text{ nanometer/sec}$$

Now let's see what will be the kinetic energy (K.E) of each electron due to this changing magnetic flux.

We know $$K.E = \tfrac{1}{2} m\, v_1^2$$

$$\text{or } K.E = \tfrac{1}{2}(9.12 \times 10^{-31}) \times (3.45 \times 10^{-9})^2 = 5.43 \times 10^{-48} \text{ Joule}$$

Now as we have applied AC to the input coil the current will obviously make the electrons move to and fro. Say for the 1$^{st}$ 5 millisecond the electrons will accelerate in the positive direction of the X-axis then for the 2$^{nd}$ 5 millisecond they will decelerate but will still keep moving in the same positive direction of the X-axis and will come to rest finally. Then when the AC will start flowing in the negative direction of its cycle, the electrons will start moving in the reverse direction in the same way mentioned above. So the electrons will keep vibrating along a straight line of (3.45 nm×2)=6.9 nm maximum. So we see that there will be no real movement of electrons for transferring the energy from the In Put Coil (A) to the Out Put Coil (B). Then how the energy from the In Put Coil (A) gets transferred to the Out Put Coil (B) in FIG. 1g?

As the electrons will vibrate they will produce a changing electromagnetic field in the same frequency as the AC in the In Put Coil. We will calculate that electromagnetic field and then we will see what will be the influence of that electromagnetic field of an electron in the vicinity. If there is no energy loss then we can conclude that the energy from one end of the tube will get transferred to the other end of the tube without any loss. This is because if there is no loss in the transfer of energy between the 1$^{st}$ pair of electrons then consecutively when there is a transfer of energy between the 2$^{nd}$ and the 3$^{rd}$ then between the 3$^{rd}$ and the 4$^{th}$ there will be no loss of energy as all the electrons are in the same state i.e. all of them are free and inside a vacuum tube having only their spin quantum numbers and all other quantum numbers constant or eliminated.

Now let's do the calculation:—

We have calculated above the force experienced by the 1$^{st}$ electron due to the Input coil. Now let's see what will be the influence for 1$^{st}$ electron on 2$^{nd}$ electron? For this we will have to calculate the variable magnetic flux caused due to the vibration of the 1$^{st}$ electron.

From the equation $F_1 = q \cdot (v \times B) \sin \theta$ where '$F_1$' → required force 'q' → charge of an electron
'v' → velocity of the electron
'B' → magnetic field Here we will choose the 2$^{nd}$ electron from the pool of electrons in such a way so that $\sin \theta = 1$. [$\theta = 90°$]

$$\text{So } B = F_1/(q \cdot v) = (6.3 \times 10^{-37})/\{(1.602 \times 10^{-19}) \times (3.45 \times 10^{-9})\} = 1.14 \times 10^{-9} \text{ Wb}.$$

One point must be noted here that the above calculated force ($F_2$) and also the velocity of the 1$^{st}$ electron varies with time and hence here this calculated "B" will also vary with time and as all the above calculations done on the basis of a 50 cycles/sec AC and r.m.s value of the voltage was taken i.e. 230 volt we need not integrate the variable force ($F_2$) to get the total force or calculate the final velocity of the 1$^{st}$ electron due to acceleration or deceleration. Another important point that has to be mentioned here is that during all the calculations of 'F' or 'B' or 'v' the lower limit of the calculations is always taken as ZERO as this is a typical property of a sinusoidal AC.

Now let's calculate the force $F_2$ experienced by the 2$^{nd}$ electron due to the varying electromagnetic field caused by the 1$^{st}$ electron. Now if this has to happen there should be an interaction between the two electrons. Now as electrons are charged particles the interaction between them will take place with the help of the electric field that persists in the surrounding area of each electron. This phenomenon is formulated by Coulomb and the expression for this is:

$$Fc = (1/4\Pi \in) \times \{(q_1 \times q_2)/r^2\}$$

Now in the above expression the value of $(1/4\Pi \in)$ is constant, the value of $(q_1, q_2)$ is also constant for two electrons. So what can vary is "r" i.e. the distance between two electrons. So if the electrons are too close to each other the force between them will be enormous and a lot of work has to be done externally to bring two electrons close to each other. So we can't calculate the force from here without knowing the right distance between the two electrons so that there is a proper interaction between the two electrons so that energy can get transferred without any loss. So to get the right distance between the 1$^{st}$ and the 2$^{nd}$ electron we should know the force between them if we want to derive the distance by using coulomb's law. Again the 2$^{nd}$ electron is in the varying electromagnetic flux caused by the 1$^{st}$ electron. So we can know the force by using the equation $F = q \cdot v \times B \sin \theta$ as B and q is already known here. We have considered the 2$^{nd}$ electron w.r.t. the 1$^{st}$ electron in such a way so that $\sin \theta = 90° = 1$. Now what about 'v'? Our motto is no loss transmission. So the 2$^{nd}$ electron should have the same kinetic energy as the 1$^{st}$ one. Here also in case of K.E. ($\tfrac{1}{2} mv^2$) mass of an electron is constant so only the velocity of the 2$^{nd}$ electron that can give the 2$^{nd}$ electron the same K.E. as the 1$^{st}$ one. Again in coulomb's law all others are constant except than the distance between the two electrons and if the two electrons are in each other's vicinity there will a fore between the two because that's the intrinsic property of the electrons. Now if this force is just to give the 2$^{nd}$ electron the velocity equal to the 1$^{st}$ one by coulomb's law just distance between them should be right. The 1$^{st}$ electron will do it by its intrinsic property of its electric field and will exert the force on the 2$^{nd}$ electron giving it just the right velocity and hence equal Kinetic energy. So to solve it mathematically we have to do the back calculation i.e. let us assume that the 2$^{nd}$ electron has a velocity of $6.9 \times 10^{-8}$ m/sec.

$$\text{So } F_3 = q \cdot v \times B \sin \theta = (1.602 \times 10^{-19}) \cdot (3.45 \times 10^{-9}) \times (1.14 \times 10^{-9}) = (6.3 \times 10^{-37}) \text{ Newton}.$$

Now from coulomb's law:

$$Fc = (1/4\Pi \in) \times \{(q1 \times q2)/r^2\}$$

$$\text{or } r^2 = (1/4\Pi \in) \times \{(q_1 \times q_2)/Fc\}$$

$$\text{or } r^2 = (8.99 \times 10^9) \times \{(1.602 \times 10^{-19})^2/(6.3 \times 10^{-37})\}$$

$$\text{or } r = 3.6 \times 10^8 \text{ meter}.$$

So any FREE electron in a Spherical area of $3.6 \times 10^8$ meter radius from the 1$^{st}$ electron and if the electric field of the two electrons are perpendicular to each other will conduct the energy without any loss from one end of the vacuum tube to the other end even if the tube is 100s of kilometers long, at room temperature.

Now let's calculate the amount of charge necessary to induce e.m.f. in the Out Put Coil due to the electrons inside the tube of length 1 m and of 2 cm in diameter to make the tube a New Free Electron Wire for loss free electrical transmission. Now here one point we should carefully consider and i.e. we cannot have electrons too far from each other or in other words the electrons should be close to each other considerably so that there is no loss of energy while transmission of electricity or any kind of energy. We need to calculate this because, remember, we are doing all the above calculation with respect to one electron only.

We know that the e.m.f. induced in a coil due to change of flux is $$e = -n(d\Phi/dt)$$

where e → the induced e.m.f.

d$\Phi$ → the flux change n → number of turns of the coil t → time taken for the change of flux − → sign indicates that the induced e.m.f. will be in the opposite direction of the change of flux Now from the above equation we can calculate the amount of charge necessary inside the volume of the free electron wire covered by the input coil to transfer the whole amount of energy supplied by the In Put Coil (A) to the Free Electron Wire. So if there is no loss during the electrical conduction there should be a 230 volt/2 ampere, AC in the secondary coil. So from the equation let's calculate the induction for each electron 1$^{st}$ $$e = -n(d\Phi/dt) = 1000 \times (1.14 \times 10^{-9}) = 1.14 \times 10^{-6} \text{ volts.}$$

So if there is $2.02 \times 10^8$ electrons in the area covered by the output coil in the vacuum tube then there will be 230 volt/2 ampere AC, in the out put coil which is exactly the same as the input coil. This fixed number of electrons can be termed as a constant for the "New Free Electron Wire" at Room Temperature. Even if the area of coils be increased or decreased the number of electrons in that area remains fixed. Hence the density of the electrons can be reduced by increasing the covered area by the Input and Out Put Coil for easy and cost effective commercial production by making a suitable adjustment between the required electron density and the area of the Input and Output Coils.

Now we must examine the effect of the free electrons inside the tube, on the electrons of the wall of the vacuum tube. We take the diameter of the vacuum tube to be 2 cm or 20 mm. To do this let us consider a very small volume 'dv' of the allotted space for electrons. Let the influence on every coulomb of electrons due to the free electrons present inside the considered small volume dv be dE.

Let the influence due to all free electrons inside the tube on the considered electrons is $E_T$.

∴ To get $E_T$ we have to integrate dE over the total volume or $$E_T = \int_{5.244 \times 10^{-31}}^{78.54} dE$$

[As volume cannot be zero I have consider the above calculated $5.244 \times 10^{-31}$ m$^3$ as the lower limit of the integration]

Now we know that volume ($V_1$)=length×breadth×height or in this case of the cylinder concerned, it will be $\Pi r^2 \times h$ Where r → radius of the vacuum tube h → length of the vacuum tube Now, if we integrate 'dv' over the total length of the tube, we will get the total volume and hence automatically the total no of free electrons will get considered. We will also assume that the free electrons are all lying on the circumference of their spiral path. Now if we look at the FIG. 2 carefully we will see that r' and r both are constants and only 'h' varies. Now let us prepare for the integration. For integrating we will take the lower limit ($\alpha$) equal to that of the diameter of an electron i.e. $\alpha = 2 \times (2.5 \times 10^{-14})$ m = $5 \times 10^{-14}$ m and the upper limit equal to 1 m.

∴ The total volume $$V_1 = \int_{5.244 \times 10^{-31}}^{78.54} dv = \Pi \times r'^2 \times \int_{\alpha}^{A} dh$$

Let the amount of charge present in the considered volume dv be dq also let the charge density $\rho$=dq $$\therefore \text{The total charge } Q = \int_{5.244 \times 10^{-31}}^{3.14 \times 10^{-5}} dq = \rho \times \int_{\alpha}^{A} dv \quad \text{eq. (i)}$$

Now we will calculate the value of $\rho$. To do this we will consider the volume dv=$\Pi$×(radius of the cylindrical shaped space allotted for electrons)$^2$×(diameter of an electron)=$\Pi \times (0.005)^2 \times (5 \times 10^{-14}) = 3.93 \times 10^{-12}$ cm$^3$ = $3.93 \times 10^{-18}$ m$^3$. Now $\rho$ will be equal to the amount of electrons present in this volume.

$$\therefore \rho = (3.93 \times 10) \div (5.244 \times 10^{-31}) = 7.5 \times 10 \text{ electrons} = (7.5 \times 10^{12}) \times (1.602 \times 10^{-19}) = 1.204 \times 10^{-6} \text{ coulomb}$$

We know electric field E=($\frac{1}{4\Pi\in}$)×(q/r'$^2$)

Now let for the electrons present in dv the electric field on unit volume of the glass wall be dE.

$$\therefore E_T = \int_{5.244 \times 10^{-31}}^{78.54} dE$$

$$dE = \int_{\alpha}^{A} (1/4\Pi\varepsilon) \times (dq/r'^2)$$

$$= [(1/4\Pi\varepsilon)/r'^2] \times \int_{\alpha}^{A} dq$$

Now from eq. (i)

$$\therefore E_T = \int_{5.244 \times 10^{-31}}^{78.54} dE$$

$$dE = [\{(1/4\Pi\varepsilon) \times \rho\}/r'^2] \times \int_{\alpha}^{A} d(\Pi \times r^2 \times h)$$

$$= [\{(1/4\Pi\varepsilon) \times \rho \times \Pi \times r^2\}/r'^2] \times \int_{\alpha}^{A} dh$$

$$\therefore E_T = \int_{5.244 \times 10^{-31}}^{78.54} dE$$

$$dE = [\{(1/4\Pi\varepsilon) \times \rho \times \Pi \times r^2\}/r'^2] \times [h]_{\alpha}^{A}$$

$$\therefore E_T = \int_{5.244 \times 10^{-31}}^{78.54} dE$$

$$dE = [\{(1/4\Pi\varepsilon) \times \rho \times \Pi \times r^2\}/r'^2][.4 - 5 \times 10^{-14}]$$

$$\therefore E_T = [E]_{5.244 \times 10^{-31}}^{3.14 \times 10^{-5}} = [\{(1/4\Pi\varepsilon) \times \rho \times \Pi \times r^2\}/r'^2] \times .4$$

$$\therefore E_{T = E \times (3.142 \times 10^{-5})} = [\{(1/4\Pi\varepsilon) \times \rho \times \Pi \times r^2\}/r'^2] \times .4$$

$$\therefore E_{T = E} = [\{(1/4\Pi\varepsilon) \times \rho \times \Pi \times r^2\}/r'^2] \times .4/(3.142 \times 10^{-5})$$

∴ Putting the value of ($\frac{1}{4\Pi\in}$), $\rho$, $\Pi$, r$^2$, r'$^2$ we get $$E_T = [\{(8.99 \times 10^7) \times (1.204 \times 10^{-6}) \times \Pi \times (0.005)^2\}/(0.005)^2] \times 0.4/(3.142 \times 10^{-5})$$

∴ $E_T = 4.33 \times 10^6$ newton/coulomb/meter=$4.33 \times 10^6$ volt/meter²

Figure 3:
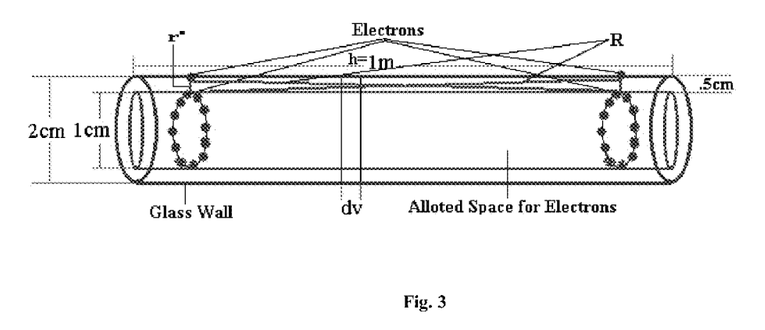
FIG. 3: Shows schematically how the electron of the body of the New Free Electron Wire may get influenced by the free electrons trapped in the core of the wire.

Here one point should also be made clear i.e. about R shown in the FIG. 3. We have considered electron at one end of the tube in a very small volume dv and with the help of that and with a series of calculation we have calculated the influence of the total amount of free electrons on every coulomb of electrons on the glass wall of the tube. Now it may appear that the distance R between the considered electrons and electrons on the other end of the tube will vary as we will proceed from our consider end of the tube to the other end of the tube. But we have set our calculation in such a way that we need not consider R. This is because we have consider dv a very small volume in which R=r' and where both r' & R are constants, and dE the small electric field on the glass wall due to the electrons present in dv. Then we have integrated dE over the total volume to get the total amount of electric field $E_T$ on every coulomb of electrons of the glass wall of the vacuum tube. Thus the complication of varying R has been eliminated.

So form the above calculation that amount of voltage in no where enough to cause electron emission from the wall of the vacuum tube (4a).

Thus the vacuum tube made up of alternate layers of Ceramic or Polymer or Dielectric Material or Teflon (PTFE=Polytetrafluoro ethylene, PFA=Perfluoro alkoxy, FEP=Fluorinated ethylene), as per requirement ($2_1$, $4a_2$) and Silicon Oxy-Nitride ($SiO_2$—$Si_3N4$-$SiO_2$) or Silicon Dioxide ($SiO_2$) or Silicon Nitride ($Si_3N_4$) or Ceramic Materials or Polymers or Dielectric Materials ($2_2$, $4a_3$) with free electrons inside and with two identical Input and Output coils on both ends of the tube with an AC voltage across the input coil will transport the electrical energy delivered by the input coil to the wire to the out put coil at the other end of the wire without any loss at room temperature and it will maintain its property even at few hundred degrees of centigrade. This specially designed wire for loss free electrical transmission at room temperature is termed as "New Free Electron Wire".

Few Primary Steps of the Production Technique of the New Free Electron Wire with Single Input and Single Output and Only One Single Use (In the diagrams the enhancement of scale by diameter and compressed by length of the wires, make them look like test tubes, which they are not. Actually these wires will no where be different in physical looks from normal copper wires)

$1^{st}$ Step: To construct the body of the New Free Electron Wire with alternate layers of Ceramic or Polymer or Dielectric Material or Teflon (PTFE=Polytetrafluoro ethylene, PFA=Perfluoro alkoxy, FEP=Fluorinated ethylene), as per requirement ($1a_3$, $2_1$) and thin film from 1 nanometer to 100 millimeter of Silicon Oxy-Nitride (SiO2-Si3N4-SiO2) or Silicon Dioxide (SiO2) or Silicon Nitride (Si3N4) or Ceramic Materials or Polymers or Dielectric Materials ($1a_2$, $2_2$), as described before of a considerable length (say 100 meters) with one end sealed and the other end open as shown in the FIG. 1a and FIG. 2. Finally there will me thin film of metal encapsulation ($1a_1$, $2_3$) to cover the whole wire as shown in FIGS. 1a & 2.

$2^{nd}$ Step: The open end of the New Free Electron Wire has to be connected to the vacuum pump first though a specially designed Sealing Base and then through a good quality high vacuum stopcock to create vacuum. The vacuum should be at the order of $10^{-4}$ torr or above. FIG. 1b.

$3^{rd}$ Step: After the vacuum gets created close the stopcock and now connect to the free electron generation device nozzle. The outer most metal cover of the wire should be connected to a positive potential terminal to drag electrons inside the wire and to create the required density of electrons inside the wire. The set up will work like that of a capacitor with the metal encapsulation as the positive terminal, the free electrons inside as the negative terminal and the body of the tube made up of Ceramic or Polymer or Dielectric Material or Teflon (PTFE=Polytetrafluoro ethylene, PFA=Perfluoro alkoxy, FEP=Fluorinated ethylene), as per requirement ($1a_3$, $2_1$) and Silicon Oxy-Nitride ($SiO_2$—$Si_3N4$-$SiO_2$) or Silicon Dioxide ($SiO_2$) or Silicon Nitride ($Si_3N_4$) or Ceramic Materials or Polymers or Dielectric Materials ($1a_2$, $2_2$) as the dielectric. FIG. 1c.

$4^{th}$ Step: After the device gets filled with the required density of electrons, connect the grid of the sealing base to a high negative potential to prevent the escape of free electrons and then apply heat on the open face of the Sealing Base to melt the Teflon to seal the wire permanently. Then put a sealing cap on the newly sealed face to finally seal it off. During this process make sure that the metal encapsulation remains connected to the positive potential. Now when the positive potential will be turned off from the metal encapsulation it will leave behind the free electrons trapped inside. FIG. 1d.

$5^{th}$ Step: Now Peal off a portion of the metal encapsulation ($1a_3$, $2_3$) at a few centimeters away from one end of the New Free Electron Wire. The static electric filed due to the free electrons trapped inside should be manifested from the pealed off portion. If not, then there must be some problem and which has to be determined to rectify until there is a clear and strong manifestation of static electric field through the opening of the metal encapsulation ($1a_3$, $2_3$) before proceeding any further. FIG. 1e.

$6^{th}$ Step: If the steps till No. 5 are all right then put a copper coil over the pealed portion of metal encapsulation.

$7^{th}$ Step: Peal off the metal encapsulation ($1a_3$, $2_3$) on the other end of the New Free Electron Wire as mentioned in step 4 and put an identical copper coil like the one mentioned in step 6. FIG. 1f.

$8^{th}$ Step: Connect one of the copper coils with an Alternating Current (A.C) supply and put a load (say a 100 to 500 watt electric bulb) across the other coil.

$9^{th}$ Step: When the A.C will be switched on in coil [A], the bulb connected to the other coil [B], at the other end will start glowing with full brightness proving the loss free transmission of electricity delivered to the New Free Electron Wire through coil [A] over the distance of (say 100 meters) and delivered to the bulb through coil [B], at room-temperature. FIG. 1g.

Figure 5A:
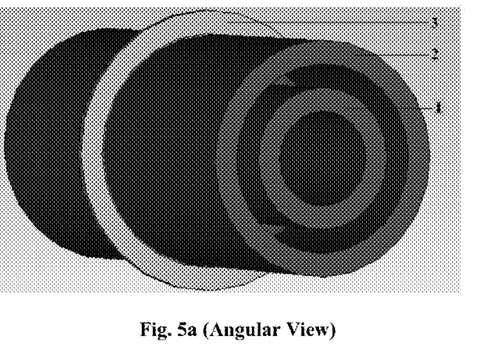
FIG. 5a, 5b, 5c: Shows schematically the two components that will be used for sealing the New Free Electron Wire without loosing the vacuum and the free electrons inside wire.
Figure 5B:
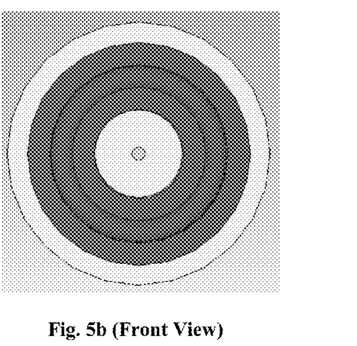

Different Types of Specially Designed Sealing Bases and Sealing Caps Discussed in Step 4 i) Sealing Base:

Quick Overview:—A cylindrical shaped device made up of the same material as that of the New Free Electron Wire itself, with a separation and a Metal Grid in between as shown in FIG. 5a, 5b.

Figure 5C:
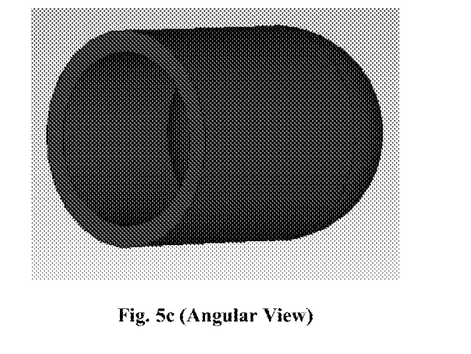

Discussion:—It will be a device like two concentric cylinders fitted one into another. Two different sets of same kind of such cylindrical water glass like structures need to be fitted back to back with a hole at the centre and with a metal grid separation [3]. But this shape has to be made up with the same material as that of the wire itself. The nozzle of the free electron generating gun can be fitted in the inner cylindrical gap [1] or can be fitted in between the inner and outer cylinder [2], at one end and at the other end of the Sealing Base [5a] the open end of the New Free Electron Wire has to be fitted. The metal Grid [3] will be connected to a high negative potential to prevent any loss of free electrons during the sealing after the vacuum and charging the wire with free electrons is done. This Grid [3] will work like that of the grids of vacuum diode in old days. There will also be a thread on the outer cylinder at the free end of the Sealing Base [5a] to put on the Sealing Cap [5c].

ii) Sealing Cap:

Quick Overview:—This will be made up of the same material as that of the wire itself as shown in FIG. 5c.

Discussion:—Nothing more than any ordinary bottle cap with a thread inside to fit on the Sealing Base.

This is a very simple setup to prove the validity of the invention or show only one utility i.e. loss free transportation of energy in electrical form, physically in a very small scale, with single input and single output, and in the most economic way. But during actual commercial production and use the New Free Electron Wire will be a little bit more sophisticated and gorgeous, with more innovative techniques e.g. devices that will enable to join the pieces of the wire, devices that enable to take out branch lines from the wire, devices that will be used at the end of a network to deliver electricity for end use, devices that will be used as a connector between the coils made by this wire inside an electrical appliance and the power source etc.

Outcome: A 230 volt, 2 ampere A.C was delivered through the input coil [A] of the test prototype for New Free Electron Wire, into the wire, by adopting the above mentioned methods. The electrical energy got transported to the other end of the wire and delivered through the output coil [B] to a load connected across the output coil [B], of maximum capacity as that of the input energy, without any loss and at room temperature, to run the load, as shown in the final schematic diagram of step 9. There were four very sensitive digital multi-meters, dived in two sets. The 1$^{st}$ two set of meters were connected with the input coil—one in series with the input coil and the other one in parallel with the input coil measuring the volt and ampere of the current delivered to the input coil from a AC source. Among the other two multi-meters, one was connected in series with the load and the output coil and the other one was connected across the output coil to measure the volt and current taken out through the out put coil to drive the load. The load was a 500 watt electric halogen lamp which glowed fully on the application of 230 volt/2 ampere A.C. across the input coil. Randomly selected at any instant of time the readings at all the four digital multi-meters connected with the input and output coils showed same readings. Also there was a huge manifestation of varying electromagnetic field which was measured and recorded with the help of a gauss meter.

I claim:

1. A free electron wire comprising a closed evacuated tube containing free electrons,
   (i) wherein the evacuated tube has alternating layers of materials chosen from a first group of materials and materials chosen from a second group of materials,
   (ii) wherein the materials of the first group comprises Silicon Oxy-Nitride ($SiO_2$—$Si_3N_4$—$SiO_2$), Silicon Dioxide ($SiO_2$), Silicon Nitride ($Si_3N_4$), Ceramic Materials, Polymers and Dielectric Material and the materials of the second group comprise Polytetrafluoro ethylene (PTFE), Perfluoro alkoxy (PFA), Fluorinated ethylene (FEP),
   (iii) wherein the evacuated tube is encapsulated by an outer metal layer,
   (iv) and wherein the evacuated tube has an input device at one end and an output device at its other end.

2. A free electron wire as in claim 1 wherein the pressure within the evacuated tube should be of the order of $10^{-4}$ torr or more.

3. A free electron wire as in claim 1, wherein the density of free electrons within the evacuated tube should be $2.02 \times 10^{14}$ electrons per cubic meter or within a range of $2.02 \times 10^0$ per cubic meter to $2.02 \times 10^{999}$ per cubic meter.

4. The free electrons of the free electron wire, as in claim 1, 2 or 3, can be replaced with positively or negatively charged particles or ions.

5. A free electron wire as in claim 1, wherein both the input device and the output device may be composed of metal, semiconductor or non-metal.

6. A free electron wire as in claim 5 wherein both the input device and the output device may, when composed of metal, be in the form of coils or electrodes.

7. A electrically conducting means comprising a plurality of electrically-connected free electron wires, as in claim 1, 2, 3, 5, or 6.

* * * * *